United States Patent
Miyazaki

(10) Patent No.: US 10,693,439 B2
(45) Date of Patent: Jun. 23, 2020

(54) CRYSTAL VIBRATOR AND CRYSTAL VIBRATION DEVICE

(71) Applicant: KYOCERA Corporation, Kyoto-shi, Kyoto (JP)

(72) Inventor: Shiro Miyazaki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 306 days.

(21) Appl. No.: 15/561,084

(22) PCT Filed: Mar. 18, 2016

(86) PCT No.: PCT/JP2016/058811
§ 371 (c)(1),
(2) Date: Sep. 25, 2017

(87) PCT Pub. No.: WO2016/158520
PCT Pub. Date: Oct. 6, 2016

(65) Prior Publication Data
US 2018/0062613 A1    Mar. 1, 2018

(30) Foreign Application Priority Data

Mar. 18, 2016 (JP) ................................. 2015-067059

(51) Int. Cl.
*H03H 9/13* (2006.01)
*H03H 9/19* (2006.01)
(Continued)

(52) U.S. Cl.
CPC ............. *H03H 9/13* (2013.01); *H01L 41/053* (2013.01); *H03H 9/02023* (2013.01);
(Continued)

(58) Field of Classification Search
CPC .......... H03H 9/0519; H03H 9/19; H03H 9/13; H01L 41/053
(Continued)

(56) References Cited

U.S. PATENT DOCUMENTS

2013/0106247 A1* 5/2013 Ariji ................. H03H 9/02
310/348
2014/0361665 A1* 12/2014 Hayasaka ............ H03H 9/1021
310/348
(Continued)

FOREIGN PATENT DOCUMENTS

JP    08-107329 A    4/1996
JP    2007-124442 A    5/2007
(Continued)

OTHER PUBLICATIONS

International Search Report, PCT/JP2016/058811, dated Jun. 7, 2016, 2 pgs.

*Primary Examiner* — Forrest M Phillips
(74) *Attorney, Agent, or Firm* — Volpe and Koenig, P.C.

(57) ABSTRACT

A crystal vibrator according to the present invention includes a crystal blank generating thickness shear vibration, a pair of excitation electrodes on both surfaces of the crystal blank, and a pair of extraction electrodes respectively extracted from the excitation electrodes. The crystal blank includes a region provided with a plurality of hill parts which are covered by an excitation electrode. Due to hill parts, it is possible to increase adhesion to the excitation electrodes and to provide a highly reliable crystal vibrator.

6 Claims, 7 Drawing Sheets

(51) Int. Cl.
   *H03H 9/02*     (2006.01)
   *H03H 9/10*     (2006.01)
   *H01L 41/053*   (2006.01)
   *H03H 9/05*     (2006.01)

(52) U.S. Cl.
   CPC ...... *H03H 9/02062* (2013.01); *H03H 9/0519* (2013.01); *H03H 9/1021* (2013.01); *H03H 9/19* (2013.01)

(58) Field of Classification Search
   USPC .......................................................... 310/348
   See application file for complete search history.

(56) References Cited

U.S. PATENT DOCUMENTS

| | | | |
|---|---|---|---|
| 2015/0123742 A1* | 5/2015 | Naito | H03H 9/17 331/158 |
| 2015/0143914 A1* | 5/2015 | Lim | H01L 41/083 73/658 |
| 2016/0079514 A1 | 3/2016 | Tai et al. | |
| 2016/0164490 A1* | 6/2016 | Kamijo | H03H 9/0509 310/348 |
| 2016/0190426 A1* | 6/2016 | Kobayashi | H03H 9/21 310/348 |

FOREIGN PATENT DOCUMENTS

| | | |
|---|---|---|
| JP | 2008-109538 A | 5/2008 |
| JP | 2013-070351 A | 4/2013 |
| WO | 2014/188842 A1 | 11/2014 |

\* cited by examiner

FIG.5
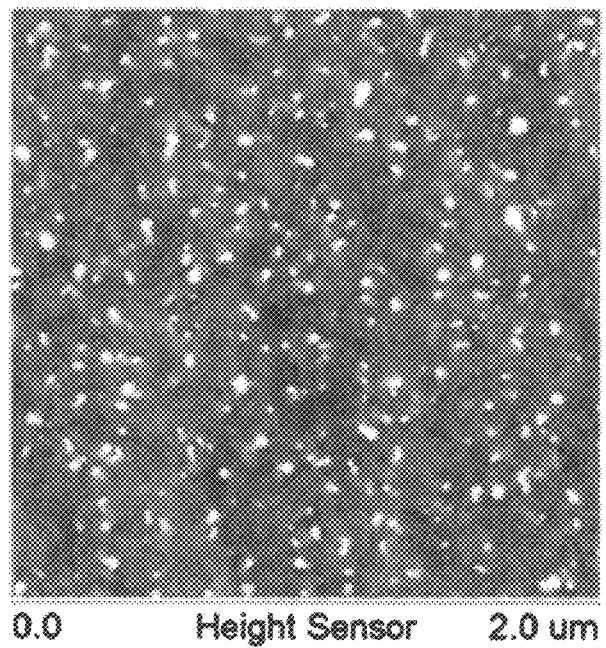
TOP VIEW
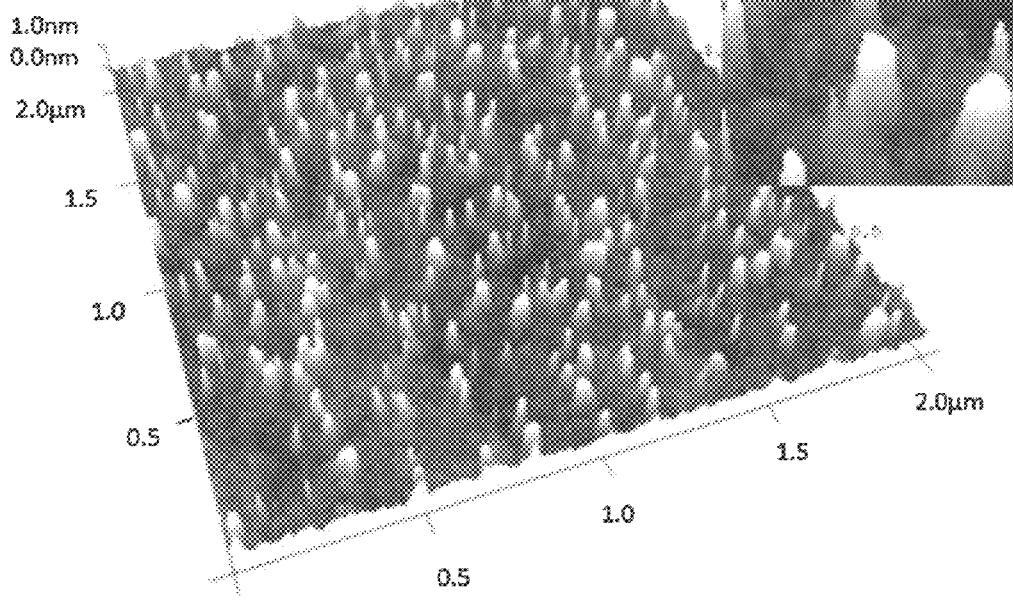
BIRD'S EYE VIEW
ENLARGEMENT OF PRINCIPAL PART OF BIRD'S EYE VIEW

FIG.6
TOP VIEW
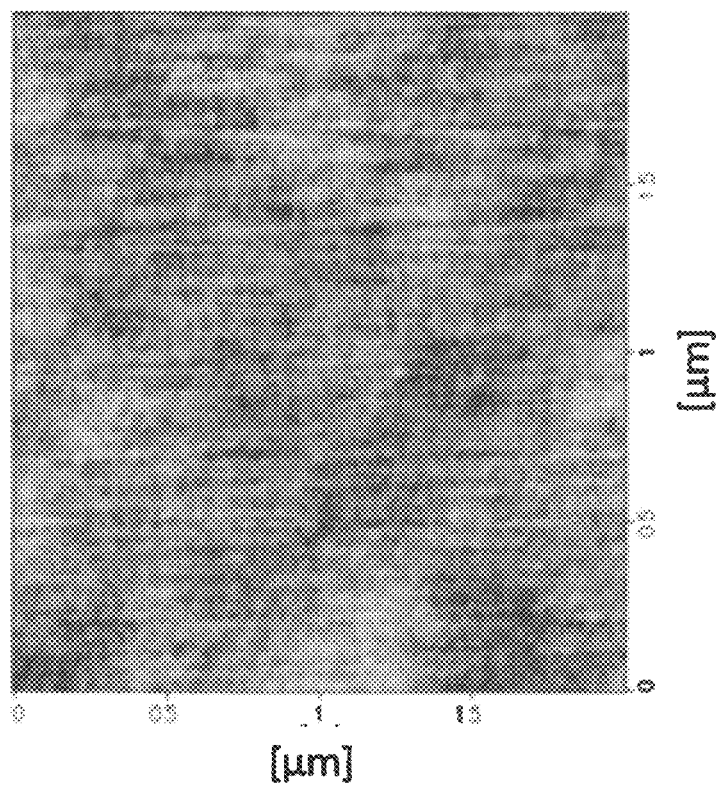
BIRD'S EYE VIEW
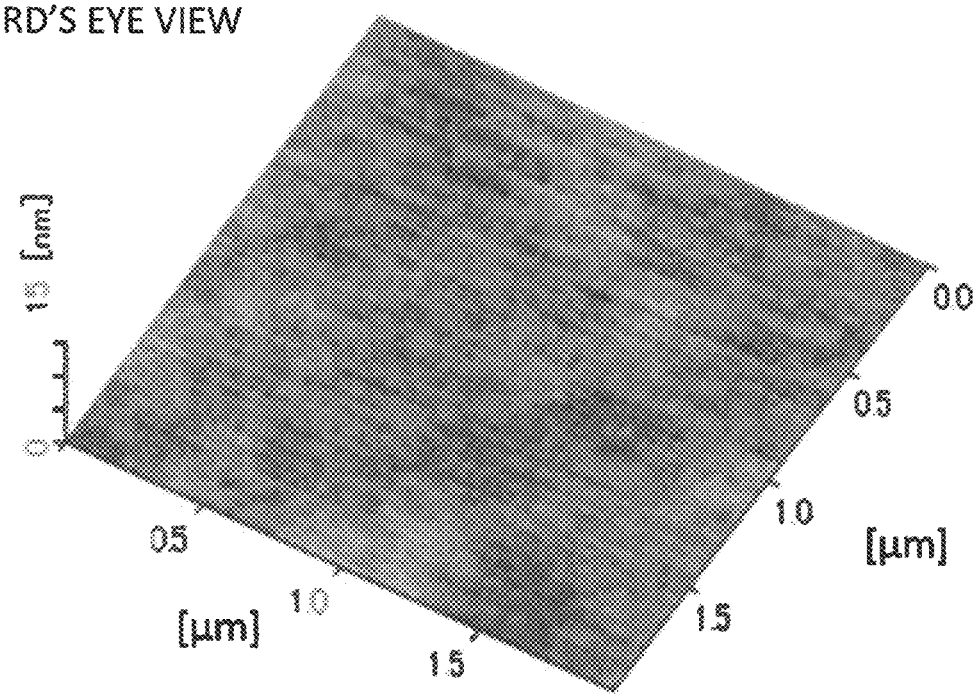

FIG.7
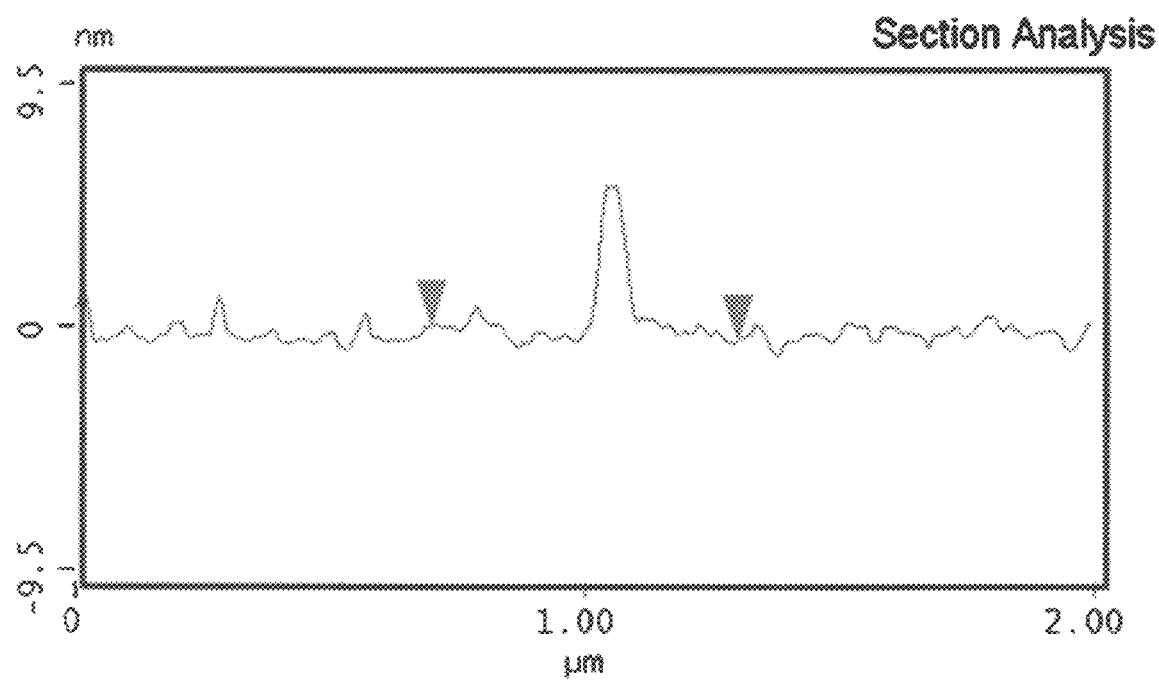
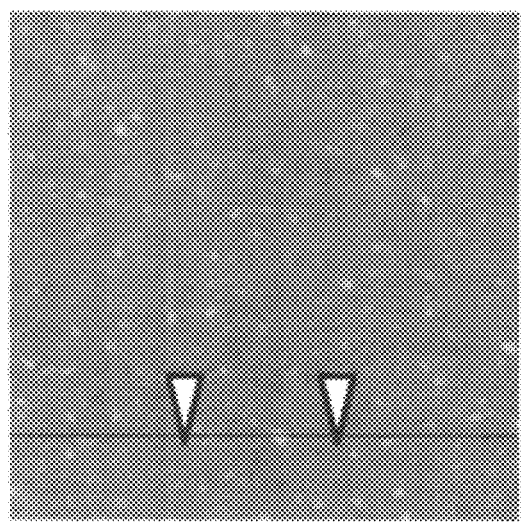
RESULT OF AFM MEASUREMENT
(TOP VIEW)

CRYSTAL VIBRATOR AND CRYSTAL VIBRATION DEVICE

TECHNICAL FIELD

The present invention relates to a crystal vibrator and a crystal vibration device.

BACKGROUND ART

An AT-cut or other thickness shear crystal vibrator is known as a frequency control element and is used as the reference standard for frequency and time in oscillators in various types of electronic apparatuses.

In such a crystal vibrator, for example as shown in Japanese Patent Publication No. 2008-109538A, a pair of excitation electrodes which face each other in the thickness direction are formed at the center of an AT-cut rectangular crystal blank, and extraction electrodes respectively extracted from this pair of excitation electrodes up to the end parts of the crystal blank are formed.

SUMMARY OF INVENTION

Solution to Problem

A crystal vibrator according to one aspect of the present invention includes a plate-shaped crystal blank generating thickness shear vibration, a pair of excitation electrodes on both surfaces of the crystal blank, and a pair of extraction electrodes respectively extracted from the excitation electrodes. Further, the crystal blank includes a first region provided with a plurality of hill parts which are covered by an excitation electrode.

A crystal vibration device according to one aspect of the present invention includes the crystal vibrator explained above and a package fastening the crystal vibrator.

Advantageous Effect of Invention

According to the crystal vibrator and crystal vibration device described above, a high reliability is obtained.

BRIEF DESCRIPTION OF DRAWINGS

FIG. 5 shows results of AFM observation of a crystal blank according to an example.

FIG. 6 shows results of AFM observation of a crystal blank according to a comparative example.

FIG. 7 is a diagram showing a height profile of a hill part in the crystal blank according to the example.

DESCRIPTION OF EMBODIMENTS

Figure 1:
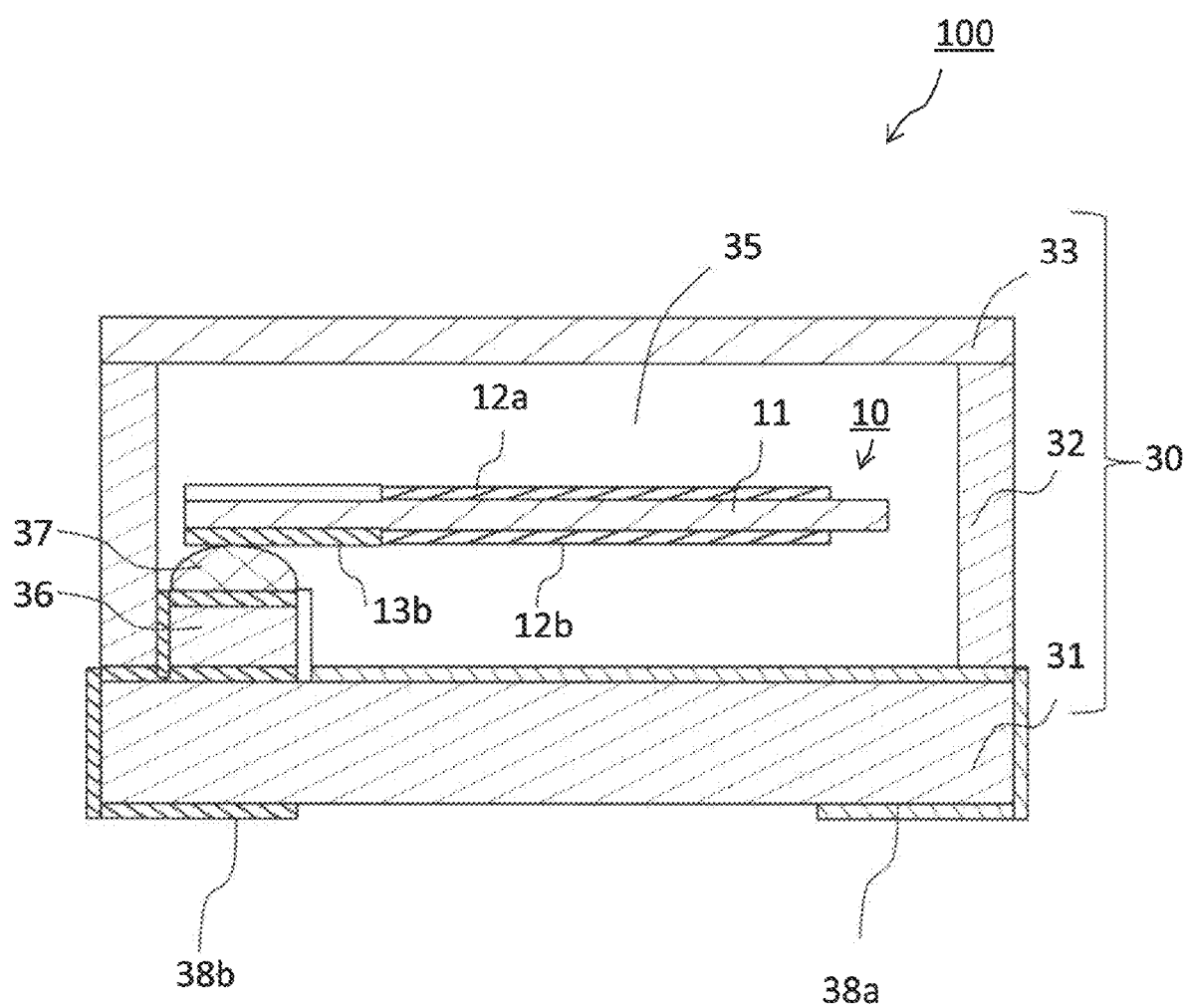
FIG. 1 is a schematic cross-sectional view of a crystal vibration device 100 according to an embodiment of the present invention.

Embodiments of a crystal vibrator and crystal vibration device according to the present invention will be explained in detail with reference to the drawings. Note that, the drawings are schematically shown. Sizes of various structures and positional relations etc. in the drawings may be suitably changed.

<<Crystal Vibration Device>>

Before the explanation of the crystal vibrator 10, an overall image of the crystal vibration device 100 holding the crystal vibrator 10 therein will be explained with reference to FIG. 1. FIG. 1 is a schematic cross-sectional view of the crystal vibration device 100. The crystal vibration device 100 is provided with the crystal vibrator 10 and a package 30 holding that.

The package 30 is provided with a first substrate 31, a frame part 32 arranged on the upper surface of the first substrate 31, and a second substrate 33 closing the opening of the frame part 32. The package 30 is one for sealing the crystal vibrator 10. The first substrate 31 and frame part 32 can be obtained by for example machining a ceramic, glass, organic material, or other material having an insulation property to desired shapes. The first substrate 31 and the frame part 32 may be formed by using separate members and bonding them together or may be integrally formed using the same material. Further, a ceramic multilayer substrate may be used to form a ceramic package with a cavity formed by the frame part 32.

For the second substrate 33, the same material as that for the first substrate 31 may be used. Alternatively, a flat plate of metal may be used as a lid part. When using the same material as that for the first substrate 31, stress generated in the package 30 can be suppressed even in a case with a heat history, therefore a crystal vibration device 100 having a high reliability can be provided.

When using metal, air-tight sealing can be easily achieved, therefore a crystal vibration device 100 having a high productivity and high reliability can be provided. As such a metal material, use can be made of an Fe—Ni alloy, Fe—Ni—Co alloy, or other general lid material. The material can be joined to the frame part 32 by using AuGe, AuSn, or another general metal joining agent.

In a housing space 35 (cavity) of the package 30, a pedestal part 36 is provided arranged on the first substrate 31. The pedestal part 36 is provided in order to hold the crystal vibrator 10 so that it is separated from the inner wall of the package 30. By the pedestal part 36, the crystal vibrator 10 can be held in a vibratable state. Such a pedestal part 36 is not particularly limited so far as its material has an insulation property. For example, use may be also made of the same material as that for the first substrate 31 and frame part 32.

Figure 2:
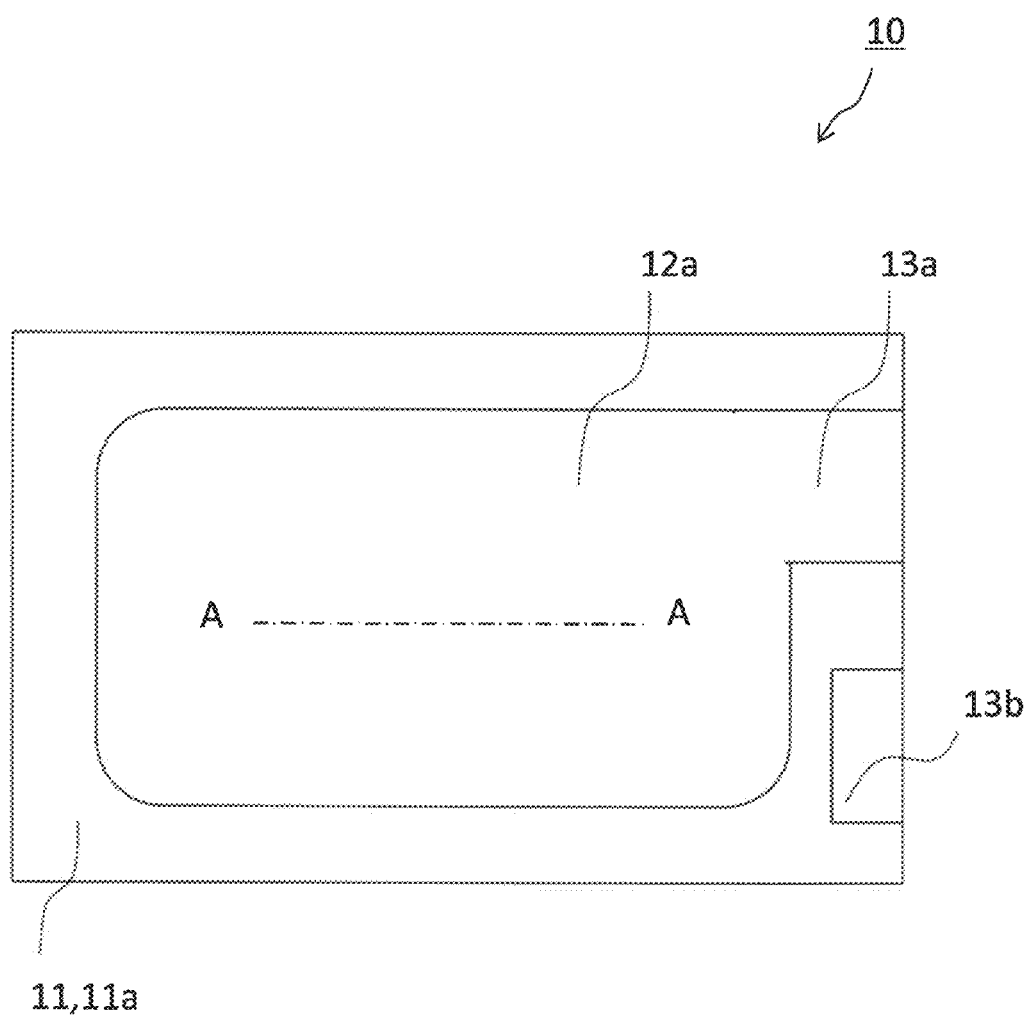
FIG. 2 is a schematic top view of a crystal vibrator 10 according to an embodiment of the present invention.

On such a pedestal part 36, the crystal vibrator 10 is held through conductive adhesives 37. The crystal vibrator 10, as shown in FIG. 2, is provided with a plate-shaped crystal blank 11, a pair of excitation electrodes 12 (12a, 12b) formed on the two major surfaces (11a, 11b) thereof, and a pair of extraction electrodes 13 (13a, 13b) which are electrically connected to the excitation electrodes 12.

Note that, by adjusting the amount and wettability of the adhesives 37, the pedestal part 36 may be omitted as well. That is, the adhesives 37 may be directly provided on the first substrate 31 as well.

The crystal blank 11 is cut at a specific cut angle. For example, use may be also made of an AT cut cutting the crystal at a cutting angle whereby, relative to the Y-axis among the crystal axes of a quartz crystal, the YZ plane is inclined by 35° 15' about the X-axis from the Z-axis to the Y-axis direction. The excitation electrode 12a is formed so that the vicinity of the center of one major surface 11a of the crystal blank 11 becomes the center thereof. The excitation electrode 12b is formed so that it is arranged opposite to the excitation electrode 12a and the vicinity of the center of the other major surface 11b of the crystal blank 11 becomes the center thereof. Further, the extraction electrode 13a is extracted in order to connect the excitation electrode 12a to an external circuit. Specifically, the extraction electrode 13a is electrically connected to the excitation electrode 12a, is extracted up to the end part of the major surface 11a of the crystal vibrator 11, and extends up to the other major surface 11b through the side surface. Here, the extended position is determined so that it is not connected to the excitation electrode 12b. In the same way, the extraction electrode 13b is electrically connected to the excitation electrode 12b, is extracted up to the end part of the major surface 11b of the crystal blank 11, and extends up to the major surface 11a through the side surface.

In such a crystal vibrator 10, vibration of 1 MHz to several hundred MHz is generated due to "thickness shear" of the two major surfaces 11a and 11b of the crystal blank 11 moving in opposite directions. The frequency of such vibration can be controlled by the planar shape and thickness of the crystal blank 11 and the planar shape and thickness of the excitation electrode 12. For example, the crystal blank 11 may be made a rectangular planar shape with a short edge side of 0.1 to 2.0 mm, a long edge side of 0.3 mm to 3.0 mm, a thickness of 1 µm to 70 µm, and a thickness of the excitation electrodes 12 of 0.1 µm to 1 µm.

Here, the extraction electrode 13a is connected through the adhesive 37 to an external electrode 38a. In the same way, the extraction electrode 13b is connected through the adhesive 37 to an external electrode 38b. More specifically, two adhesives 37 are provided for one crystal vibrator 10 and individually connected to the extraction electrode 13a extracted to the major surface 11b and to the extraction electrode 13b positioned on the major surface 11b.

The external electrodes 38 are extracted from the pedestal part 36 to the outside of the housing space 35. In this example, they extend up to the surface on the opposite side to the side connected to the frame part 32 of the first substrate 31, that is, the lower surface. Due to this, by mounting the crystal vibration device 100 on a not shown circuit board or the like at the lower surface of the first substrate 31, connection with the external circuit becomes possible.

In a case where the first substrate 31, frame part 32, and pedestal part 36 are formed by a multilayered ceramic package or formed by a multilayer organic substrate, such external electrodes 38 may be realized by for example forming vias penetrating through the layers and providing through conductors.

Note that, in this example, an electronic device such as an oscillation circuit is not arranged in the housing space 35. However, another electronic device may be arranged in the housing space 35 as well.

<<Crystal Vibrator 10>>

Figure 3:
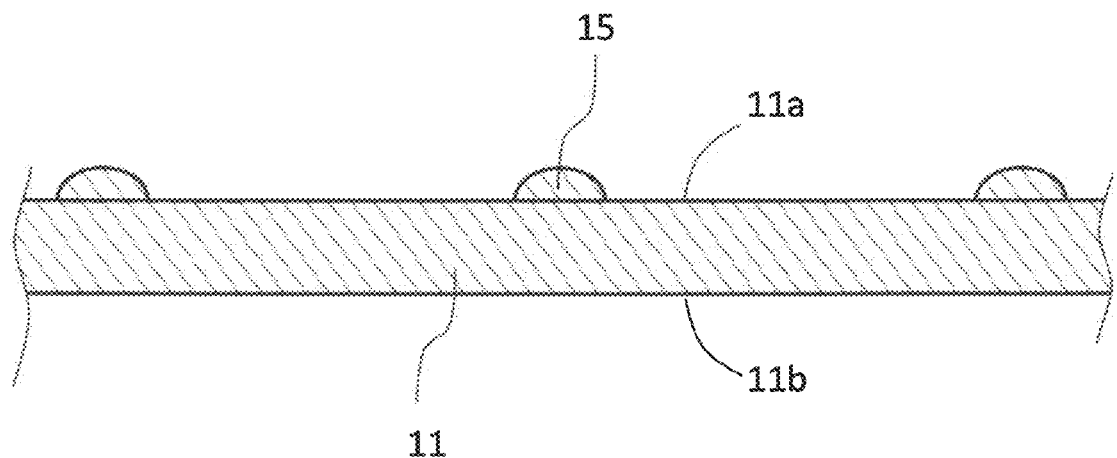
FIG. 3 is a cross-sectional view of a principal part in a crystal blank.

The crystal vibrator 10 in the present embodiment is as already explained by using FIG. 2. The crystal blank 11 will be explained in further detail. FIG. 3 is a cross-sectional view of a principal part taken along a line A-A in FIG. 2. In FIG. 3, illustration of the excitation electrodes 12a and 12b is omitted.

As shown in FIG. 3, in the crystal blank 11, regions covered by the excitation electrodes 12 are provided with pluralities of hill parts 15. By providing such pluralities of hill parts 15, the contact areas with the excitation electrodes 12 increase, and an anchoring effect is generated. Therefore, a bonding strength between the excitation electrodes 12 and the crystal blank 11 can be raised. Due to this, a crystal vibrator 10 having a high reliability can be provided.

Such hill parts 15 are reduced in size to an extent where almost no influence is exerted upon the vibration frequency, and a large number of these parts are arranged. Due to this, it is possible to improve adhesion with the excitation electrodes 12 in a state exerting little influence upon the vibration frequency. Specifically, the height of the hill parts 15 may be made 0.1% or less of the thickness of the crystal blank 11. The hill parts 15 are scattered. Therefore, where the hill parts 15 are made such a size, the rate of increase of volume caused by the hill parts 15 becomes further smaller. Therefore, substantially, it becomes harder for the hill parts 15 to exert an influence upon the frequency of the crystal vibrator 10.

On the other hand, the height of the hill parts 15 is clearly different from the variation of the thickness of the crystal blank 11. Therefore, it is made higher than the squared mean value Rq of the crystal blank 11. For example, in actual circumstance, it is known that the Rq can be improved up to about 5 nm by grinding and polishing the crystal blank 11 and adjusting the surface conditions (see "Advance in Mirror Finishing Technology" supervised by Akira Kobayashi). In the case of such surface conditions, hill parts 15 having a height larger than 5 nm may be provided.

The height of the hill parts 15 may be made higher than the variation σ of the thickness of the crystal blank 11 as well. The crystal blank 11 desirably has a uniform thickness for the purpose of controlling the vibration frequency of the crystal vibrator 10 to a desired value. When seeking not only surface roughness, but also uniformity of the thickness for the crystal blank 11, the waviness or unevenness caused by variation of the thickness at the time of the processing by conventional grinding, etching, etc. becomes small. In this way, when the thickness of the crystal blank 11 becomes uniform and a becomes smaller, the reliability can be raised more if the hill parts 15 are provided. For example, when realizing a variation of thickness giving a variation of the frequency of ±2500 ppm relative to the vibration frequency of the aimed thickness of the crystal blank 11, the effect of improvement of the reliability by the hill parts 15 is obtained.

Further, the diameter of the bottom face of the hill parts 15 may be made larger than the height as well. By making the diameter of the bottom face large compared with the dimension of the height, the surface area of the hill parts 15 is increased and the coverability by and adhesion with the excitation electrodes 12 are improved as well. Further, the chance of the hill parts 15 becoming sources of sparks can be reduced.

Specifically, the hill parts 15 may be also formed flatter than the semispherical shapes so as not to become projecting parts. For this purpose, the dimensional ratio of the height relative to the bottom face in the hill parts 15 may be made ½ or less. Further, for obtaining the effect of the increase of surface area of the hill parts 15, the dimensional ratio of the height relative to the bottom face may be made 1/20 or more. Further, the surface of the hill parts 15 may be curved as well. Furthermore, when viewed in a cross-sectional view in the thickness direction, at the major surfaces 11a and 11b, the angle (contact angle) formed by the plane excluding the hill parts 15 and the hill parts 15 may be an acute angle as well.

The crystal blank 11 has plurality of such hill parts 15. The interval of these plurality of hill parts 15 is not particularly limited. However, they may be provided at an interval of for example about 100 nm to 200 nm. By providing the hill parts 15 at such intervals, the adhesion of the excitation electrodes 12 formed on the crystal blank 11 can be raised. That is, the metal particle size which contributes to the formation of the film at the time of the formation of the excitation electrodes 12 by a thin film forming technique such as the vapor deposition process or sputtering process is about 50 nm to 100 nm. By trapping these individual metal particles among the hill parts 15, gaps among the metal particles can be buried by the hill parts 15. Due to this, the adhesion of the excitation electrodes 12 can be raised by the hill parts 15.

As a concrete example of such hill parts 15, for example, when machining with a precision giving a variation σ of thickness of the crystal blank of 11 is 5 nm, the hill parts 15 may be formed so that the height is 50 nm or less, the diameter of the bottom face is 100 nm or less, and the density is 100/μm$^2$ or less.

The hill parts 15 may be formed at the same time as the time when the crystal blank 11 is processed to have a constant thickness. That is, by locally changing the thickness by local plasma machining (plasma assisted chemical etching (PACE), plasma jet, plasma chemical vaporization machining (CVM)) method, local reactive etching (RIE) method, or the like, hill parts 15 having a desired shape can be obtained.

Note that, in the example shown in FIG. 3, the hill parts 15 are provided on only the major surface 11a. Here, the major surface 11a is the surface positioned on the second substrate 33 side which becomes the lid part when holding the crystal vibrator 10 in the package 30. When manufacturing the crystal vibration device 100, after the crystal vibrator 10 is fastened on the pedestal part 36, the frequency characteristics are sometimes adjusted by etching the exposed excitation electrodes 12 (the excitation electrode 12a in this example) and changing their thickness and shape while monitoring the frequency characteristics by applying voltage between the excitation electrodes 12. As in the present example, in the crystal vibrator 10, when the hill parts 15 are provided on the surface (11a) on the opposite side to the surface on the side which is directly fastened to the package 30, even in a case where local stress is generated according to the process of machining of the excitation electrode 12a, the adhesion between the excitation electrode 12a and the crystal blank 11 can be secured.

<<Modification>>

Figure 4:
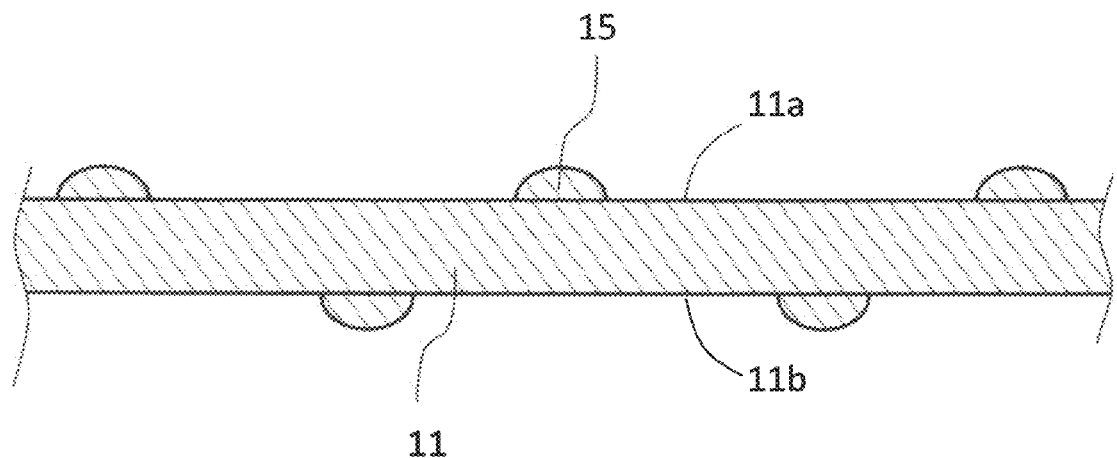
FIG. 4 is a cross-sectional view of a principal part showing a modification of the crystal blank.

As shown in FIG. 4, the hill parts 15 may be formed on the two major surfaces (11a, 11b) of the crystal blank 11 as well. In this case, the adhesion between the excitation electrodes 12 and the crystal blank 11 can be raised on the two major surfaces (11a, 11b), therefore a crystal vibrator 10 having a higher reliability can be provided. In FIG. 4 as well, illustration of the excitation electrodes 12 is omitted.

Further, both of FIG. 3 and FIG. 4 referred to only regions in the crystal blank 11 which are covered by the excitation electrodes 12. However, the parts may also be arranged on the surfaces in the two major surfaces (11a, 11b) which were exposed from the excitation electrodes 12. In this case as well, the hill parts 15 are very small and are scattered, therefore there is no influence upon the vibration frequency of the crystal vibrator 10.

Note that, if an inclined surface were provided on a side surface of the crystal blank 11 for sealing in the vibration, in order to more effectively seal vibration in the central part of the crystal blank 11, the hill parts 15 need not be provided on the inclined surface.

Further, when viewed in a plan view, the hill parts 15 may not be superimposed on each other at the two major surfaces (11a, 11b).

An embodiment of the present invention was illustrated above, but the present invention is not limited to the embodiment explained above. Needless to say the present invention may be made any form unless out of the object of the present invention.

EXAMPLES

A crystal blank 11 shown in FIG. 3 was formed. Specifically, an AT-cut quartz crystal was worked to an aimed thickness of 30 μm and a uniform thickness and hill parts 15 were formed. To make the thickness uniform, the plasma CVM method was used to locally generate plasma and thereby locally etch the crystal. Here, by making the plasma dwell time different in accordance with the desired amount of working, the crystal blank was worked to the desired thickness in the entire planar surface.

Crystal thickness before processing: 30 μm to 32 μm

Variation in crystal thickness before processing: 20 nm to 120 nm

Thickness of crystal blank 11 after processing: 30 μm±0.01 μm

Variation of thickness (σ) of crystal blank 11 after processing: 5 nm or less The surface conditions of the crystal blank 11 processed in this way and of a quartz crystal in a comparative example which was processed by usual wet etching were measured according by an atomic force microscope (AFM). The results of observation of an example will be shown in FIG. 5, and the results of observation of a comparative example will be shown in FIG. 6. As seen from the results, it was confirmed that in the example, a plurality of hill parts 15 having a height not more than 20 nm and a width (diameter of bottom face) not more than 60 nm could be formed on the crystal blank 11. Such hill parts could not be confirmed on the surface of the quartz crystal in the comparative example.

Note that, in the measurement results of the AFM, the order (μm) of the plane direction and the order (nm) of height direction are different. For this reason, the hill parts 15 appear as narrow width projections. In actuality, however, they have broad hill shapes. Note that, FIG. 7 shows a height profile of one hill part 15. In this way, the state of clearly projecting from the surroundings could be confirmed.

Next, the squared mean values Rq, centerline average roughnesses Ra, and maximum heights Rmax in the example and comparative example were calculated based on the AFM images. The results were as follows. Note that, for the example, Rq, Ra, and Rmax of the portion excluding the hill parts 15 were calculated as well.

Example (Entire)

Rq: 0.51 nm
Ra: 0.22 nm
Rmax: 11.3 nm

Example (Except Hill Parts 15)

Rq: 0.15 nm
Ra: 0.12 nm
Rmax: 1.15 nm

Comparative Example (Entire)

Rq: 0.13 nm
Ra: 0.10 nm
Rmax: 1.17 nm

As explained above, there is no particular change in the items representing the surface roughness. It could be confirmed that hill parts 15 were formed in here and there on the uniform flat surface. Note that, in the example, the number density of the hill parts 15 was measured from four fields of view. As a result, it was 50 to 150/µm².

From this result, the influence of the hill parts 15 was studied based on the following assumptions.

Average shape of hill parts 15: 10 nm of height, 30 nm of bottom surface diameter Density of hill parts 15: 100/µm²

Interval between hill parts 15: 150 nm on average

From the assumptions explained above, the volume obtained by totaling up the plurality of hill parts 15 becomes about $2.4 \times 10^5$ nm³. This is equivalent to an increase of the thickness by about 0.24 nm per 1 µm². Here, when aiming at a crystal vibrator 10 vibrating at 52 MHz, when the thickness increases by 0.24 nm relative to the aimed thickness of 28.656 µm, the change of frequency by that becomes about 500 Hz. That is, a fluctuation of 0.001% occurs relative to the target frequency, therefore the influence upon the entire crystal vibrator 10 can be ignored.

Further, by providing such hill parts 15, the surface area could be improved by about 1.6 times. As a result, by using the crystal blank 11 in the example, the adhesion strength with the excitation electrodes 12 can be raised. In actuality, when the excitation electrodes 12 were formed on the crystal blanks 11 in the example and comparative example under the same conditions and the adhesion strengths were measured, the example showed a higher value.

From the above description, it was confirmed that the crystal vibrator 10 in the example has a higher reliability.

Note that, the above explanation was given taking as an example a crystal vibrator. However, the art is not limited to this example so far as a plate-shaped chip accompanied by vibration is combined with a multilayered configuration (an excitation electrode etc.) formed on that. The same effects can be exerted by providing the hill parts explained above on the major surface of the chip. For example, in place of the crystal substrate, use may be also made of a piezoelectric substrate made of a lithium tantalate crystal (LT substrate), lithium niobate crystal (LN substrate), or the like. Comb-shaped excitation electrodes (IDT electrodes) are formed on the major surface of this piezoelectric substrate. The IDT electrodes may be formed by using Al or Al alloy. By forming the hill parts in at least the portions covered by the IDT electrodes in the piezoelectric substrate, the adhesion between the IDT electrodes and the piezoelectric substrate can be improved.

Note that, in the same way as the case of a crystal vibrator, on the major surface of the piezoelectric substrate, the hill parts may be provided also in the portion which is not covered by the IDT electrodes as well. This is because the adhesion between the protective layer and the piezoelectric substrate can be improved in a case where the protective layer covering the IDT electrodes and the major surface of the piezoelectric substrate is formed. The protective layer may be formed by thin film made of silicon oxide or nitrogen oxide. Note that, the shape of the hill parts is the same as that in the case of the crystal vibrator.

By dicing such a piezoelectric substrate for each region including at least one IDT electrode, chip-shaped acoustic wave devices can be obtained.

From the above description, the following concepts can be extracted from the Description.

(Concept 1)
An acoustic wave device including
a piezoelectric substrate, and
an excitation electrode arranged on a major surface of the piezoelectric substrate, wherein
the piezoelectric substrate includes a plurality of hill parts which are covered by the excitation electrode.

(Concept 2)
An acoustic wave device including
a piezoelectric substrate,
an excitation electrode arranged on a major surface of the piezoelectric substrate, and
an insulating protective film covering the excitation electrode and a first region in the major surface of the piezoelectric substrate which is not covered by the excitation electrode, wherein
the piezoelectric substrate includes a plurality of hill parts in the first region.

(Concept 3)
The acoustic wave device disclosed in concepts 1 and 2, wherein the piezoelectric substrate is made of lithium tantalate crystal, and the excitation electrode is configured by a pair of comb-shaped electrodes.

REFERENCE SIGNS LIST

10: crystal vibrator, 11: crystal blank, 11a: major surface, 11b: major surface, 12a: excitation electrode, 12b: excitation electrode, 13a: extraction electrode, 13b: extraction electrode, 15: hill part, 30: package, 31: first substrate, 32: frame part, 33: second substrate, 35: housing space, 36: pedestal part, 37: adhesive, and 100: crystal vibration device.

The invention claimed is:

1. A crystal vibrator comprising:
   a plate-shaped crystal blank generating thickness shear vibration, the crystal blank comprising a pair of major surfaces,
   a pair of excitation electrodes, each excitation electrode located on a respective one of the major surfaces of the crystal blank, and
   a pair of extraction electrodes respectively extracted from the excitation electrodes, wherein
   the crystal blank comprises a plurality of hill parts which are covered by an excitation electrode, and
   heights of the hill parts are larger than a standard deviation of a thickness of the crystal blank and are not more than 0.1% of an average thickness of the crystal blank.

2. The crystal vibrator according to claim 1, wherein, with respect to the hill parts, dimensional ratios of heights relative to bottom faces thereof are $\frac{1}{20}$ to $\frac{1}{2}$ and a density thereof is 50 to 150/µm².

3. The crystal vibrator according to claim 1, wherein the hill parts are provided only on one of the major surfaces of the crystal blank.

4. A crystal vibration device comprising:
   a crystal vibrator according to claim 1, and
   a package fastening the crystal vibrator.

5. A crystal vibration device according to claim 4, wherein the package comprises a support part comprising a cavity holding the crystal vibrator therein and a lid part closing the cavity, and
   in the crystal vibrator, the hill parts are provided on only the major surface adjacent the lid part.

6. The crystal vibrator according to claim 1, wherein the heights of the hill parts are 50 nm or less.

* * * * *